United States Patent
Powers et al.

(10) Patent No.: US 8,139,507 B2
(45) Date of Patent: Mar. 20, 2012

(54) NETWORK GRAPH FOR ALTERNATE ROUTES

(75) Inventors: Richard Dickert Powers, Highland Village, TX (US); David Matthew Bellia, Allen, TX (US); Stephen J. Silva, Fort Collins, CO (US); Ryan Lee Weaver, Sacramento, CA (US); Guy Lowell Kuntz, Chico, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1610 days.

(21) Appl. No.: 10/941,433

(22) Filed: Sep. 15, 2004

(65) Prior Publication Data

US 2006/0056288 A1    Mar. 16, 2006

(51) Int. Cl.
*G01R 31/08* (2006.01)
*H04J 3/14* (2006.01)

(52) U.S. Cl. ........ 370/255; 370/252; 370/225; 370/236; 370/242; 709/239

(58) Field of Classification Search .......... 370/216–221, 370/237, 238, 248, 249, 252, 225, 236, 242, 370/254, 255; 709/239
See application file for complete search history.

(56) References Cited

U.S. PATENT DOCUMENTS

| | | | |
|---|---|---|---|
| 5,714,766 A | 2/1998 | Chen et al. | 257/20 |
| 5,841,673 A * | 11/1998 | Kobayashi et al. | 716/6 |
| 5,848,242 A | 12/1998 | Behaghel et al. | 709/218 |
| 5,937,295 A | 8/1999 | Chen et al. | 438/257 |
| 5,971,596 A * | 10/1999 | Nishikawa | 716/10 |
| 6,047,331 A * | 4/2000 | Medard et al. | 709/239 |
| 6,159,620 A | 12/2000 | Heath et al. | 428/615 |
| 6,282,170 B1 * | 8/2001 | Bentall et al. | 370/225 |
| 6,477,515 B1 * | 11/2002 | Boroujerdi et al. | 706/14 |
| 6,608,815 B1 | 8/2003 | Huang et al. | 370/232 |
| 6,701,344 B1 * | 3/2004 | Holt et al. | 709/204 |
| 6,728,205 B1 * | 4/2004 | Finn et al. | 370/217 |
| 6,741,552 B1 | 5/2004 | McCrosky et al. | 370/218 |
| 6,760,302 B1 * | 7/2004 | Ellinas et al. | 370/228 |
| 6,791,939 B1 * | 9/2004 | Steele et al. | 370/217 |
| 6,816,585 B1 * | 11/2004 | Blatt et al. | 379/221.03 |
| 6,829,216 B1 * | 12/2004 | Nakata | 370/228 |
| 6,976,087 B1 * | 12/2005 | Westfall et al. | 709/238 |
| 7,286,489 B2 * | 10/2007 | Ades | 370/254 |
| 7,308,198 B1 * | 12/2007 | Chudak et al. | 398/58 |
| 7,379,061 B2 * | 5/2008 | Castonguay et al. | 345/420 |
| 7,385,917 B1 * | 6/2008 | Mo et al. | 370/216 |
| 7,391,732 B1 * | 6/2008 | Cortez et al. | 370/238 |
| 2002/0167898 A1 * | 11/2002 | Thang et al. | 370/216 |
| 2003/0009582 A1 * | 1/2003 | Qiao et al. | 709/233 |
| 2003/0058798 A1 * | 3/2003 | Fleischer et al. | 370/238 |
| 2003/0112831 A1 * | 6/2003 | Williams | 370/535 |
| 2003/0212941 A1 * | 11/2003 | Gillies et al. | 714/726 |

(Continued)

OTHER PUBLICATIONS

Ellinas et al, Automatic Protection Switching for Link Failures in Optical Networks with Bi-directional Links, IEEE 1996, pp. 152-156.*

(Continued)

*Primary Examiner* — Chi Pham
*Assistant Examiner* — Ahmed Elallam

(57) ABSTRACT

Routes between cells in an interconnection network are represented with a graph using graph theory. Failed links are identified, and using the graph, alternative routes between cells in the graph are found.

18 Claims, 4 Drawing Sheets

U.S. PATENT DOCUMENTS

| | | | |
|---|---|---|---|
| 2003/0227877 A1* | 12/2003 | Kar et al. | 370/252 |
| 2004/0000861 A1 | 1/2004 | Dorfman | |
| 2004/0004938 A1* | 1/2004 | Buddhikot et al. | 370/238 |
| 2004/0059812 A1* | 3/2004 | Assa | 709/224 |
| 2004/0151124 A1* | 8/2004 | Hauser et al. | 370/252 |
| 2005/0049988 A1* | 3/2005 | Dahlquist et al. | 706/46 |
| 2005/0099419 A1* | 5/2005 | Castonguay et al. | 345/420 |
| 2005/0132318 A1* | 6/2005 | Kidd et al. | 716/12 |
| 2005/0243711 A1* | 11/2005 | Alicherry et al. | 370/216 |
| 2005/0286411 A1* | 12/2005 | Alicherry et al. | 370/216 |
| 2006/0136721 A1* | 6/2006 | Bruestle et al. | 713/168 |
| 2007/0027666 A1* | 2/2007 | Frankel | 703/10 |
| 2007/0177512 A1* | 8/2007 | Alexander | 370/238 |
| 2007/0177609 A1* | 8/2007 | Alexander, Jr. | 370/395.32 |
| 2007/0189191 A1* | 8/2007 | Ades | 370/254 |

OTHER PUBLICATIONS

Datta et al, Diverse Routing for Shared Risk Resource Group (SRRG) Failures in WDM Optical Networks, 2004, IEEE Computer Society, total of pages.*

Steinder et al, A Survey of fault localization techniques in computer networks, Jul. 1, 2004, Elsevier, pp. 166-194.*

* cited by examiner

NETWORK GRAPH FOR ALTERNATE ROUTES

BACKGROUND

An interconnection network is a set of communication lines and intermediate nodes between a given set of source nodes and a given set of terminal or terminating nodes, such as multi-processor computer elements known as cells. The intermediate nodes in an interconnection network typically comprise switches and hubs, referred to as nodes, between the sources and terminals. Static routing data tables have been used to identify routes used in the interconnection network. When a link between nodes is discovered to have failed, a static route around data table is used to determine a new link to route data across. The route around data table has routing information for a link if the link is the only link that fails. If multiple links fail, the table is not guaranteed to produce routes that ensure a fully connected interconnection network. Multiple links failing result in a fatal error, and shut down of the network.

Previously, systems route an interconnection network using fixed tables encoded in binary code. The code examines links in an order that the hardware supports. The hard coded tables are used to determine what values to write into the routing registers and which outbound port should be used when a bad link is discovered. This prior method is limited to working around a single bad link. A single bad link is guaranteed to have an alternate path, and a simple table lookup suffices. While having greater than one bad link might still have viable alternate paths, it is not guaranteed and the system is restricted to working around a single bad link.

DETAILED DESCRIPTION

In the following description, reference is made to the accompanying drawings that form a part hereof, and in which is shown by way of illustration specific embodiments that may be practiced. These embodiments are described in sufficient detail to enable those skilled in the art to practice the invention, and it is to be understood that other embodiments may be utilized and that structural, logical and electrical changes may be made without departing from the scope of the present invention. The following description is, therefore, not to be taken in a limited sense, and the scope of the present invention is defined by the appended claims.

The functions or algorithms described herein are implemented in software or a combination of software and human-implemented procedures in one embodiment. The software comprises computer executable instructions stored on computer readable media such as memory or other type of storage devices. The term "computer readable media" is also used to represent carrier waves on which the software is transmitted. Further, such functions correspond to modules, which are software, hardware, firmware or any combination thereof. Multiple functions are performed in one or more modules as desired, and the embodiments described are merely examples. The software is executed on a digital signal processor, ASIC, microprocessor, or other type of processor operating on a computer system, such as a personal computer, server or other computer system.

Configuration of an interconnection network can take place initially, or upon detection of failed links. A routing algorithm is provided a list of graph edges as an input that represents an interconnection fabric that is available. The routing algorithm explores the fabric in whatever order those links were provided. Each processor in the network writes the portion of fabric necessary for itself to function. As each edge is explored, a graph is updated to indicate the configuration of the hardware. The graph data is then used to write routing registers and handle bad links. Consistent rules are used to process the graph. The types of edges in the graph are those that lead to a terminating vs. non-terminating vertex.

Figure 1:
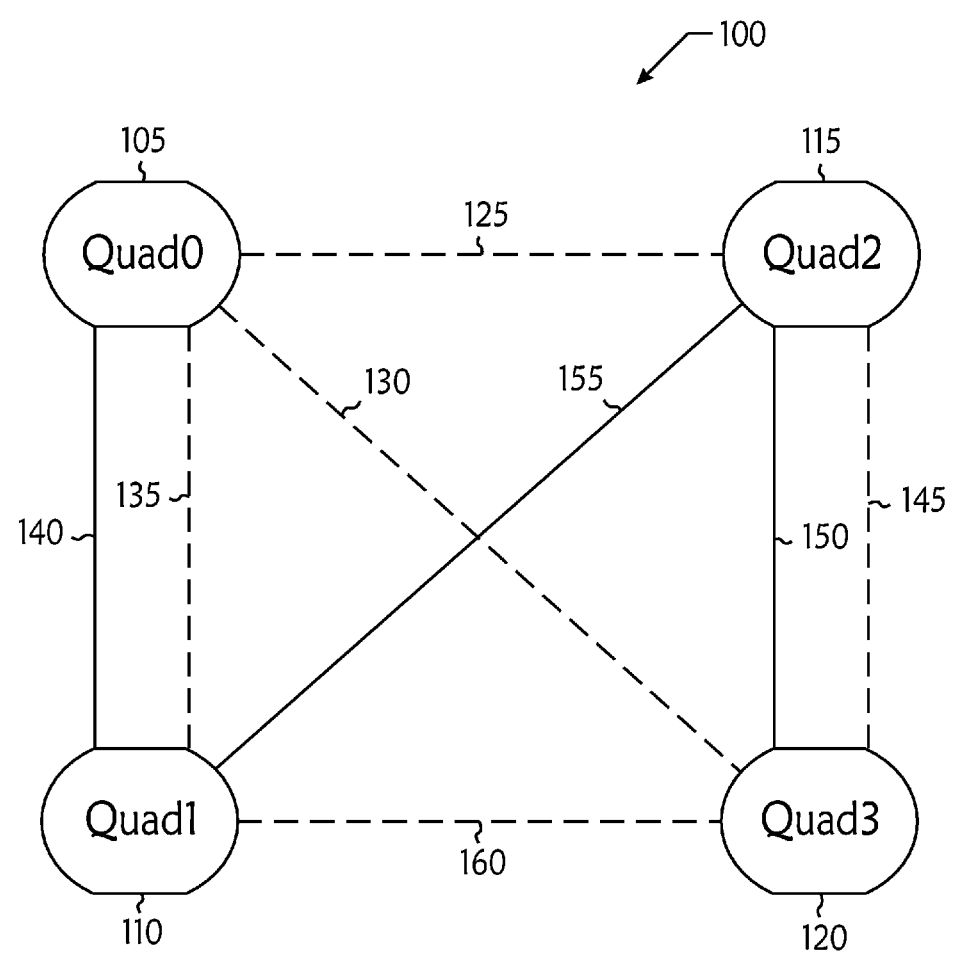
FIG. 1 is a block diagram of an interconnection network according to an example embodiment.

FIG. 1 is a block diagram of an interconnection network 100 with five broken links or connections. Network 100 is contained in a single plane in one embodiment. Network 100 comprises four Quads, Quad0 105, Quad1 110, Quad2 115 and Quad3 120. A Quad in one embodiment is a switch with four bidirectional connections. They are non-terminating vertices. Data may enter on one connection, and then be routed out on another connection of a Quad. Each of the Quads is coupled to multiple other Quads by links represented by lines. Quad0 105 is coupled to quad2 115 by link 125, Quad3 120 by link 130, and Quad 1 by two link, 135 and 140. Quad2 115 is coupled to Quad3 120 by links 145 and 150, and is coupled to Quad1 110 by link 155. Quad1 110 is also coupled to Quad3 120 by link 160.

Lines 125, 130, 135, 145 and 160 are represented by broken lines, signifying broken links or connection that have failed for one reason or another. Solid lines are used to represent good, operative links 140, 150 and 155.

Each link is represented by an edge with two vertices in one embodiment. The vertices correspond to the Quads. The edges form a graph utilizing graph theory. The graph can be queried to find routes around multiple broken links. In FIG. 1, the failed links may be routed around by using non-failed links. For example, while there is no direction operative link between Quad0 105 and Quad3 120, or to Quad2 115, both may be reached. Communications may be routed to Quad1 110 over link 140, then to Quad2 115 via link 155, and finally to Quad3 120. While this may not be very efficient, it is better than shutting down the network 100. The graph provides this rerouting each time one or more links fail.

Figure 2:
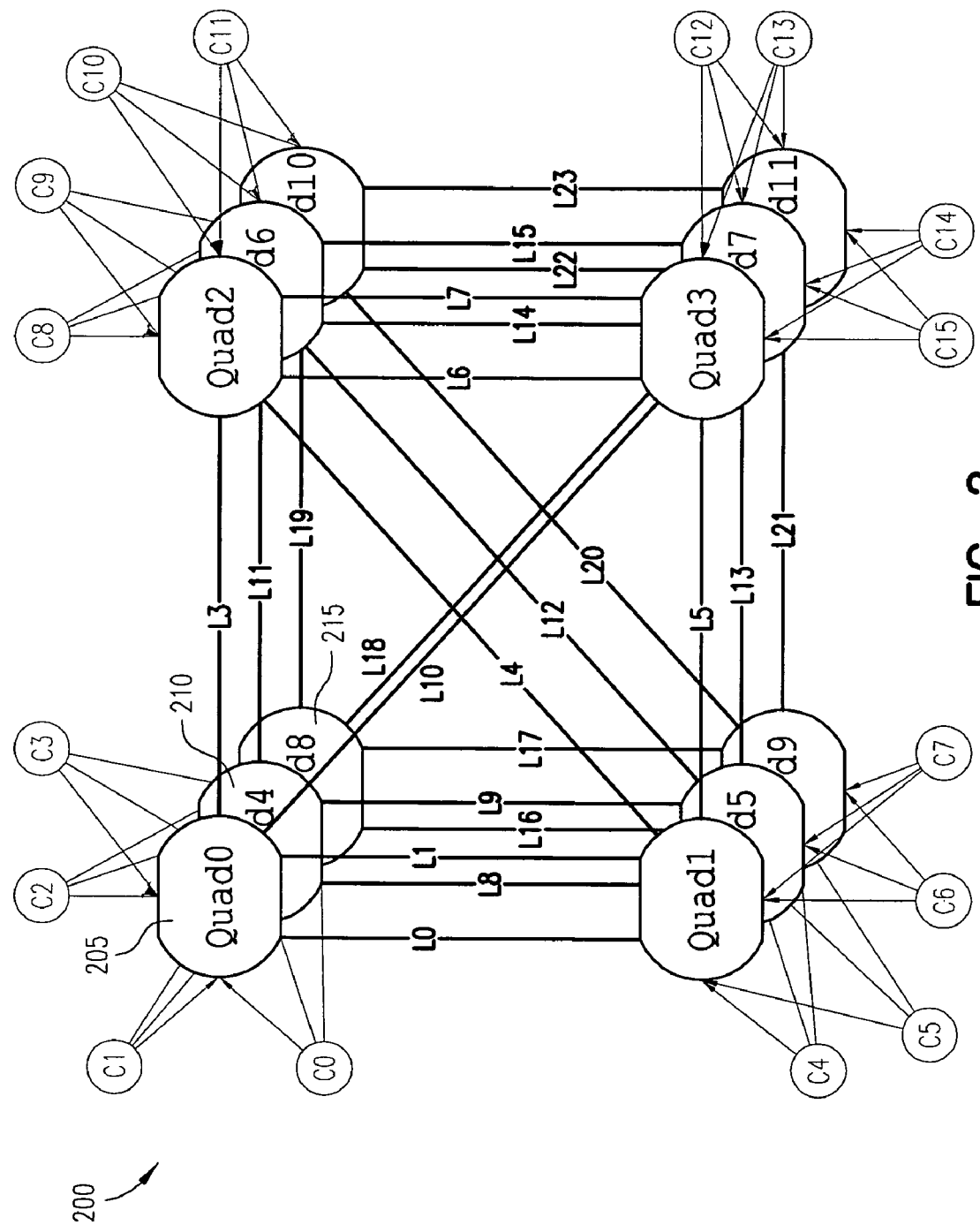
FIG. 2 is a block diagram of a multi-plane interconnection network according to an example embodiment.

FIG. 2 is a block diagram of a multi-plane interconnection network according to an example embodiment. FIG. 2 shows multiple Quads in three different planes at 200. A first plane 205 contains Quad0, Quad1, Quad2, and Quad3. A second plane contains Quad4, Quad5, Quad6 and Quad7. A third plane contains Quad8, Quad9, Quad10 and Quad11. In addition to the multiple planes of Quads, terminating vertices are also identified, and labeled with the letter "c" with a numerical suffix. These terminating vertices are linked to Quads, and such links are represented in the graph by a non-shared link edge, and in FIG. 2, by lighter lines ending in arrow heads. {A terminating vertex is one that is not routed through. In one embodiment, a terminating vertex does not provide a path to other vertices. The terminating vertices may be linked to Quads in different planes, where the Quads are normally non-terminating vertices.

Edges in the graph are internally represented in a relational database in the following format in one embodiment:

```
typedef struct __GenericEdge {
    uint8          vertex1;
    VertexType     vtype1;
    uint8          vertex2;
    VertexType     vtype2;
    PortNames      port1;
    PortNames      port2;
    uint32         edge_weight;
    EdgeColorType  color;
} GenericEdge;
```

This format includes two different types of vertices, route through, and non-route through vertices, corresponding respectively to non-terminating and terminating vertices in FIG. 2. The vertices are not equal in one embodiment. If a vertex is encountered that allows route through, then it can be routed through. If not, then it does not allow any of its edges to carry traffic away from it, unless it was the originator of the traffic.

Ports have also been added to the edge structure. Vertices use the ports to track where the edges are. This means that they can distinguish between multiple edges that are connected to the same two vertices. These two notions, different types of vertices and the addition of ports, allow graph theory to work with the interconnection networks having these types of links. A color attribute is also provided, and is indicative of whether the link is operative or inoperative.

Figure 3:
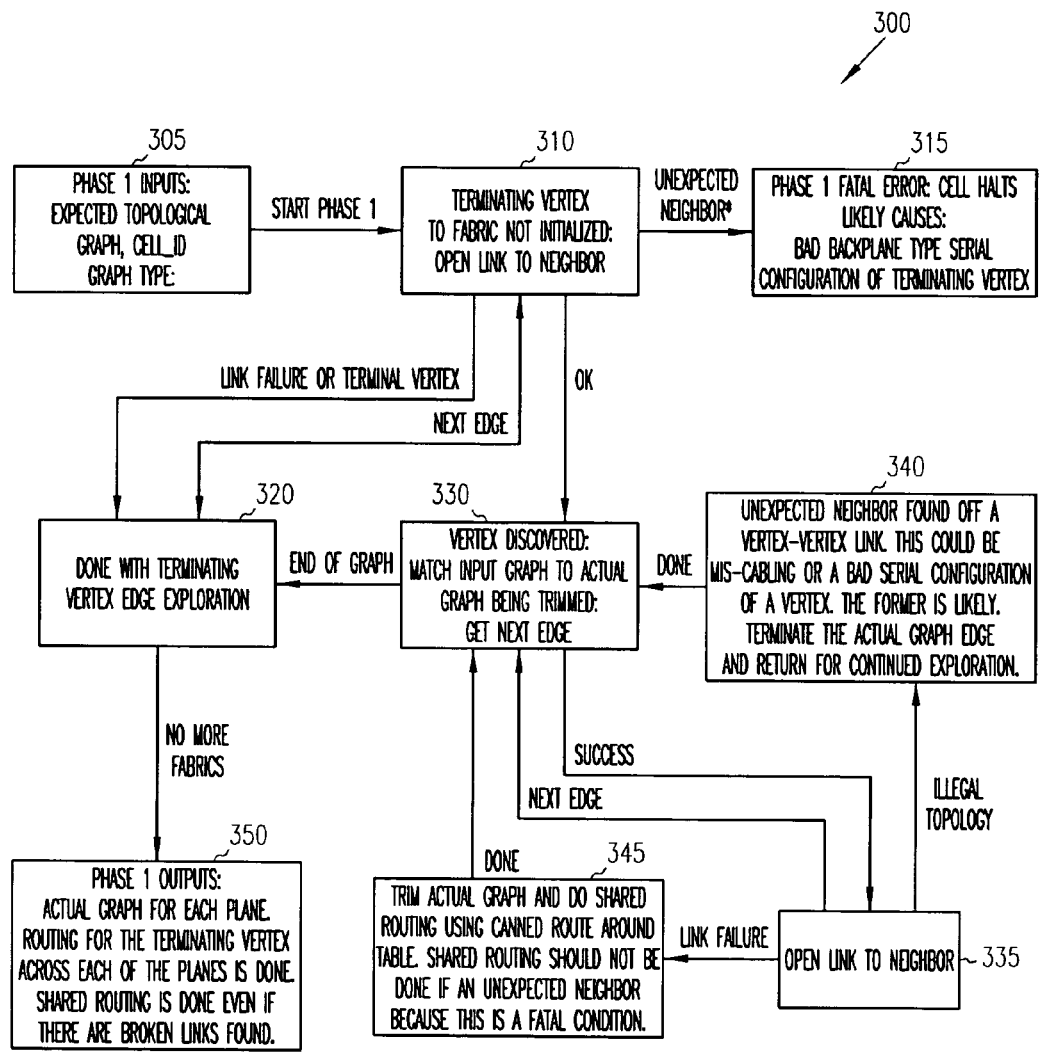
FIG. 3 is a state diagram of a process for creating a graph for each plane of the network of FIG. 2 according to an example embodiment.

FIG. 3 illustrates a state diagram of a process to create a graph for each plane of the network of FIG. 2 according to an example embodiment. FIG. 3 is a phase state block diagram showing the creation of a fabric graph generally at 300 during a cell initialization process. This process may also be run when a failed link is detected during normal operation of the interconnection network. At 305, phase one inputs are received, including an expected topological graph, a Cell_ID and graph type.

In one embodiment, the Cell_ID is an identifier of a vertex, such as a local vertex number. A cell is typically a computing element. It may contain several processors and some memory. In one embodiment, the Cell_ID is a number, such as between zero and fifteen that uniquely identifies a cell.

A graph type is an identifier that specifies which graph is being provided. The graph may be provided by inquiring to a cabinet that contains the cells, and may be predetermined based on the type of cell configuration provided in the cabinet. In one embodiment, a few predetermined topologies are available, and correspond expected predefined graphs.

The inputs are used at the beginning of phase one at 310 by a cell in the fabric, where a terminating vertex to the fabric is not initialized. A link is opened to a neighbor. If there is an unexpected neighbor, a fatal error is encountered at 315, and the cell halts. Likely causes of this include a bad backplane type serial configuration of a terminating vertex. At 310, if a link failure, or a terminating vertex is encountered, exploration of the vertex edge is done, because one cannot go further from such a terminating vertex.

If a non-terminating vertex is discovered, a link to the neighbor is opened at 335, and the input graph is matched to an actual graph being trimmed at 330. Also, the next edge is obtained, with the state returning to 310, and the exploration of the next edge. While opening a link to a neighbor at 335, if an illegal topology is found, an unexpected neighbor off a vertex-vertex link has been encountered at 340. The unexpected neighbor could be the result of a mis-cabling or a bad serial configuration of a vertex. The former may be more likely. The actual graph edge is terminated, and state 330 is entered for continued exploration of the input graph.

If, while opening a link to a neighbor at 335, a link failure is encountered, the actual graph is trimmed at 345, and shared routing may be performed using a canned route around table. Shared routing may be avoided if an unexpected neighbor is found, because this is usually a fatal condition. State 330 is then entered for further exploration of the input graph.

If the end of the graph is encountered at 330, state 320 is entered. If no more fabrics are available from 320, a phase one output is provided at 350 comprising an actual graph for each plane of the interconnection network, and routing for the terminating vertices across each of the planes is done. Shared routing may also be performed even if there are broken links found.

Phase one may be performed independent of both processor architecture and platform type. Cells may route things that are interesting to their outbound traffic. In one embodiment, different planes may be treated as independent entities. Terminating vertices have three ports each connected to a different non-terminating vertex port in one embodiment. An edge is the connection between two ports inclusive.

Figure 4:
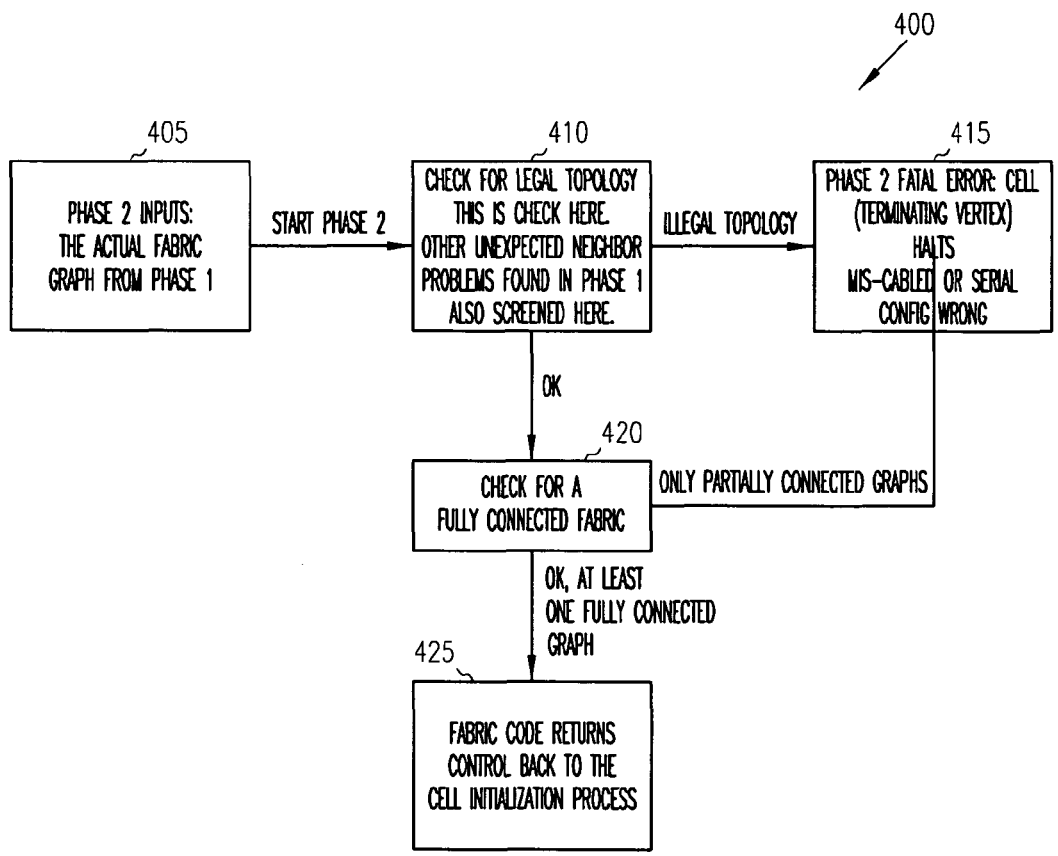
FIG. 4 is a state diagram for checking the graph created by the process of FIG. 3 according to an example embodiment.

FIG. 4 is a state diagram for checking the graph created by the process of FIG. 3 according to an example embodiment. FIG. 4 is a state block diagram of a second, phase two indicated generally at 400, that utilizes the actual fabric graph of phase one to check the fabric graph. In one embodiment, phase two is platform aware. Phase two inputs are the actual fabric graph from phase 1 at 405. Starting at 410, the actual fabric graph is checked for legal topology. Other unexpected neighbor problems found in phase one 300 are also screened. If an illegal topology is found, a phase two fatal error is generated at 415, and the cell or terminating vertex halts. A mis-cabling or wrong serial configuration has occurred.

If the Topology is ok, the fabric is checked to determine if it is fully connected at 420. If at least one fully connected graph is present, control is returned back to the cell initialization process at 425.

When a link fails, the existing trimmed fabric graph may be used to traverse the edges, and find a new way to connect the network in an operational manner. The original expected topological graph may also be used, as the process will sort out which connections or links are good, and create a graph of an operational network fabric.

Figure 5:
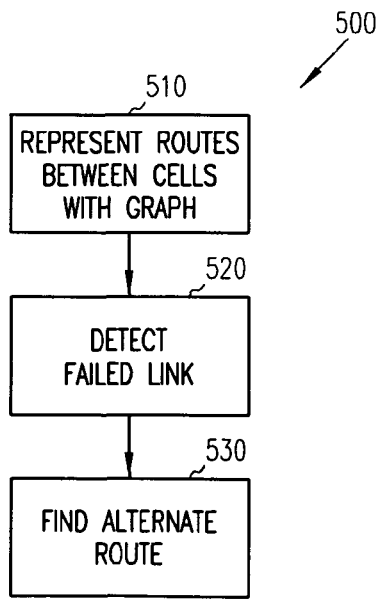
FIG. 5 is a flowchart of a process for finding alternative routes in the event of a failed link according to an example embodiment.

FIG. 5 is a flowchart of a process 500 followed when a link fails in one embodiment. At 510, the routes between cells or vertices are represented by a graph, having at least two different types as described above. At 520, a defective or failed link is detected. Multiple failed links may be detected in one embodiment. At 530, an alternative route is found, such as by querying the graph.

Computer-readable instructions for implementing the above processes may be stored on a computer-readable medium. The instructions are executable by a processing unit of a computer. A vertex may comprise such a computer. A hard drive, CD-ROM, and RAM are some examples of articles including a computer-readable medium.

The Abstract is provided to comply with 37 C.F.R. §1.72(b) to allow the reader to quickly ascertain the nature and gist of the technical disclosure. The Abstract is submitted with the understanding that it will not be used to interpret or limit the scope or meaning of the claims.

The invention claimed is:

1. A method comprising:
    generating a graph theory graph via cells, each cell comprising a processor, the graph theory graph representing routes between the cells in an interconnection network, wherein the graph theory graph is generated by the cells in response to detection of a failed link in the interconnection network;
    identifying via the graph theory graph the failed link in the graph theory graph; and
    finding via the graph theory graph an alternative route between cells in the interconnection network in the graph theory graph.

2. The method of claim 1 and further comprising identifying multiple failed links from the graph and finding alternative routes between cells, wherein the cells employ a routing algorithm that receives, as input, graph edges representing links in the interconnection network, and wherein the routing algorithm explores the links in the order the links are received.

3. The method of claim 1 wherein if no alternative route is available, indicating that the network is failing.

4. The method of claim 1 wherein a link is represented by an edge in the graph defined by two vertices corresponding to different cells.

5. The method of claim 4 wherein an edge has a weight representative of bandwidth of the corresponding link.

6. The method of claim 4 wherein an edge is one of two types, representing a route through a vertex or a terminating vertex.

7. A method comprising:
    via one or more processors:
        detecting a failed link in an interconnection network;
        querying a graph representing the interconnection network for alternate routes in response to detection of the failed link, the graph having edges representing connection between nodes in the interconnection network, and wherein the graph is constructed by cells in the interconnection network; and
        rerouting the interconnection network as a function of the alternate routes in response to detection of the failed link.

8. The method of claim 7 wherein the edges of the graph are defined by pairs of vertices, and wherein the cells employ a routing algorithm that receives, as input, edges that represent the interconnection network, and wherein the routing algorithm explores the interconnection network in the order the edges are received.

9. The method of claim 8 wherein the vertices comprise route through and terminating vertices.

10. The method of claim 9 wherein the terminating vertices are representative of memories and processors.

11. The method of claim 7 wherein the edges of the graph are representative bandwidth of the connections they represent.

12. The method of claim 11 wherein the edges of the graph further represent attributes of their corresponding connections.

13. The method of claim 12 wherein the attributes comprise whether the connection is good or failed.

14. A computer readable medium having instructions stored thereon for causing a computer to execute a method comprising:
    detecting a failed link in an interconnection network;
    querying a graph representing the interconnection network for alternate routes in response to detection of the failed link, the graph having edges representing connection between nodes in the interconnection network, and wherein the graph is constructed by cells in the interconnection network; and
    rerouting the interconnection network as a function of the alternate routes in response to detection of the failed link; and
    wherein the computer readable medium comprises a hard drive, a CD-ROM, a RAM, or a physical storage, and wherein the computer readable medium is not a carrier wave.

15. A system comprising:
    a processor;
    a module comprising code stored in memory, the code executable by the processor that detects a failed link in an interconnection network;
    a vertex discovery module comprising code stored in memory, the code executable by the processor that queries a graph representing the interconnection network for alternate routes in response to detection of the failed link, the graph having edges representing connection between nodes in the interconnection network, and wherein the graph is constructed by cells in the interconnection network; and
    an output module comprising code stored in memory, the code executable by the processor that provides a new graph that reroutes the interconnection network as a function of the alternate routes in response to detection of the failed link.

16. A method comprising:
    via one or more processors:
        traversing an expected topological graph of interconnected cells, wherein the topological graph is generated by the interconnected cells;
        matching the topological graph to an actual graph being trimmed;
        opening links to neighbors;
        trimming the actual graph when link failures are encountered; and
        outputting an actual graph.

17. The method of claim 16 and further comprising performing, via the one or more processors, shared routing on the actual graph, wherein the cells employ a routing algorithm that receives, as input, graph edges representing links in an available interconnection fabric, and wherein the routing algorithm explores the available interconnection fabric in the order the links are received.

18. The method of claim 16 wherein the expected topological graph comprises cell_IDs.

* * * * *